United States Patent
Li

(10) Patent No.: US 8,570,092 B2
(45) Date of Patent: Oct. 29, 2013

(54) CONTROL CIRCUIT FOR CONNECTOR

(75) Inventor: Jie Li, Shenzhen (CN)

(73) Assignees: Hong Fu Jin Precision industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/531,119

(22) Filed: Jun. 22, 2012

(65) Prior Publication Data

US 2013/0162324 A1 Jun. 27, 2013

(30) Foreign Application Priority Data

Dec. 26, 2011 (CN) .......................... 2011 1 0440371

(51) Int. Cl.
*H03K 17/687* (2006.01)
(52) U.S. Cl.
USPC .......................................... 327/427; 327/434
(58) Field of Classification Search
None
See application file for complete search history.

(56) References Cited

U.S. PATENT DOCUMENTS

| | | | | |
|---|---|---|---|---|
| 4,254,347 A | * | 3/1981 | Ray ................................. | 327/143 |
| 6,300,669 B1 | * | 10/2001 | Kinoshita ...................... | 257/566 |
| 7,205,808 B2 | * | 4/2007 | You et al. ...................... | 327/198 |
| 7,586,346 B2 | * | 9/2009 | Xiong ............................ | 327/143 |
| 7,917,786 B2 | * | 3/2011 | He et al. ........................ | 713/320 |
| 7,930,570 B2 | * | 4/2011 | Zou et al. ...................... | 713/300 |
| 8,013,658 B2 | * | 9/2011 | Huang ........................... | 327/392 |
| 8,145,933 B2 | * | 3/2012 | Xi .................................. | 713/323 |
| 8,205,104 B2 | * | 6/2012 | Hu .................................. | 713/300 |
| 8,269,549 B2 | * | 9/2012 | Lin et al. ....................... | 327/530 |
| 2006/0145731 A1 | * | 7/2006 | Jiang et al. .................... | 327/100 |
| 2008/0148086 A1 | * | 6/2008 | Zhang ............................ | 713/500 |
| 2009/0259859 A1 | * | 10/2009 | Zou et al. ...................... | 713/300 |

* cited by examiner

*Primary Examiner* — Tuan T Lam
(74) *Attorney, Agent, or Firm* — Altis & Wispro Law Group, Inc.

(57) ABSTRACT

A circuit for controlling a connector to transmit data according to Low Pin Count (LPC) protocol or Joint Test Action Group (JTAG) protocol includes a switch unit, first and second electronic switches, and first and second switch chips. When the switch unit outputs a high level signal to the first electronic switch, the connector transmits data according to LPC protocol. When the switch unit outputs a low level signal to the first electronic switch, the connector transmits data according to JTAG protocol.

5 Claims, 1 Drawing Sheet

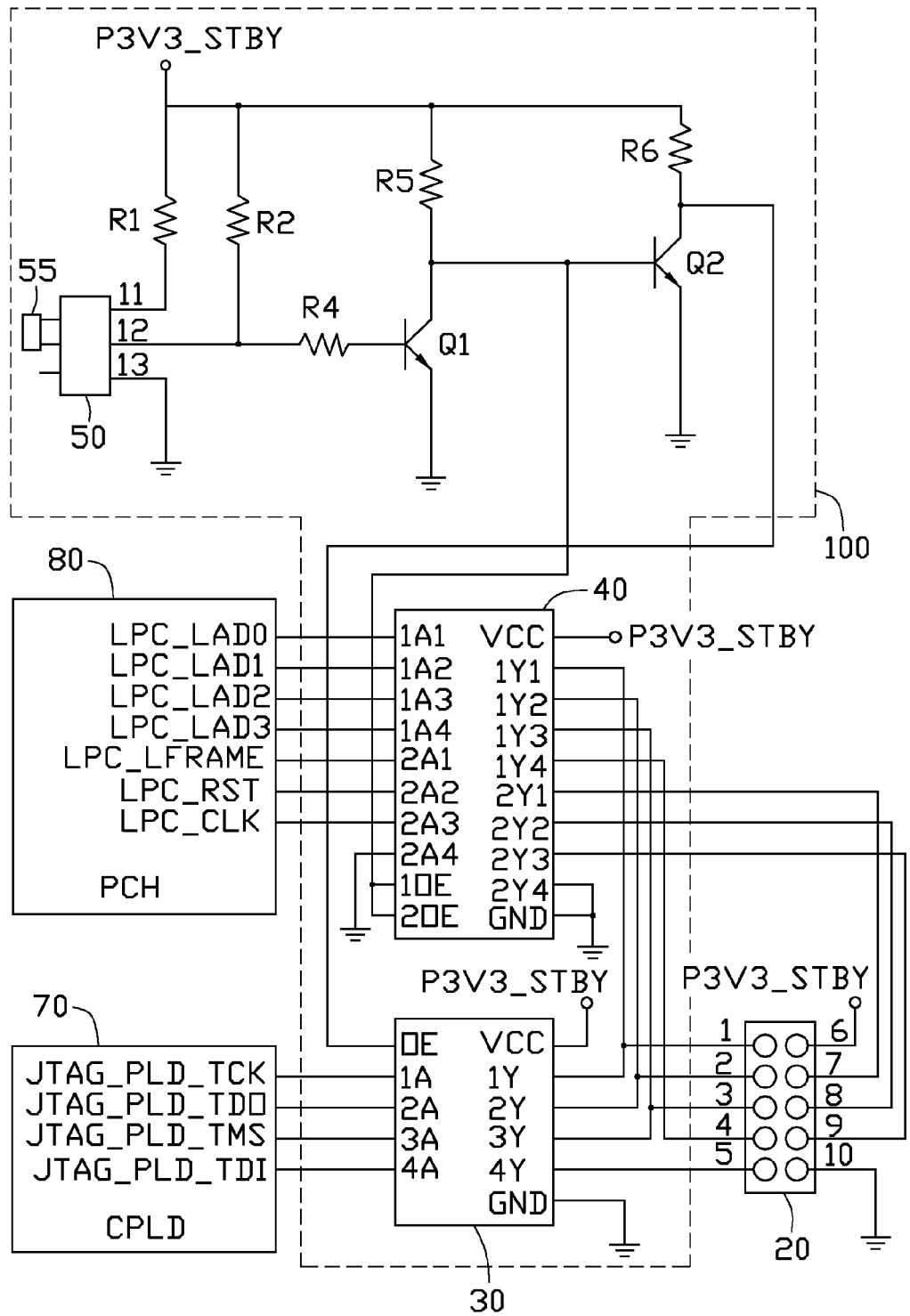

CONTROL CIRCUIT FOR CONNECTOR

BACKGROUND

1. Technical Field

The present disclosure relates to a circuit for controlling a connector.

2. Description of Related Art

To embed programs in complex programmable logic devices (CPLD) on motherboards, operators connect an integrated circuit (IC) burner to one connector of the motherboards. To test the motherboards, the operators connect a debugging card to yet another connector on the motherboard. Two connectors must be used because the testing is done using Low Pin Count protocol. However, IC burners transmit data according to Joint Test Action Group protocol, which is inconvenient, time consuming, and uses precious space.

BRIEF DESCRIPTION OF THE DRAWING

Many aspects of the embodiments can be better understood with reference to the following drawing. The components in the drawing are not necessarily drawn to scale, the emphasis instead being placed upon clearly illustrating the principles of the present embodiments. Moreover, in the drawing, like reference numerals designate corresponding parts throughout the drawing.

The FIGURE is a circuit diagram of an exemplary embodiment of a control circuit.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Referring to the FIGURE, a control circuit 100 controls a connector 20 on a motherboard to transmit data either according to Low Pin Count (LPC) protocol or Joint Test Action Group (JTAG) protocol. An exemplary embodiment of the circuit 100 includes a jumper 55, a base 50, transistors Q1 and Q2, and switching chips 30 and 40. In the embodiment, the connector 20 includes pins 1-10. The pin 6 is connected to a standby power P3V3_STBY on the motherboard. The pin 10 is grounded.

The base 50 includes terminals 11-13. The terminal 11 is connected to the standby power P3V3_STBY through a resistor R1. The terminal 12 is connected to the standby power P3V3_STBY through a resistor R2. The terminal 13 is grounded.

A base of the transistor Q1 is connected to the terminal 12 through a resistor R4. A collector of the transistor Q1 is connected to the standby power P3V3_STBY through a resistor R5. An emitter of the transistor Q1 is grounded. A base of the transistor Q2 is connected to the collector of the transistor Q1. A collector of the transistor Q2 is connected to the standby power P3V3_STBY through a resistor R6. An emitter of the transistor Q2 is grounded.

In the embodiment, the switching chip 40 includes a first group of data pins 1A1-1A4, a second group of data pins 2A1-2A4, a third group of data pins 1Y1-1Y4, a fourth group of data pins 2Y1-2Y4, enable pins 1OE and 2OE, a ground pin GND, and a power pin VCC. The data pins 1A1-1A4 are respectively connected to data pins LPC_LAD0, LPC_LAD1, LPC_LAD2, and LPC_LAD3 of a Platform Controller Hub (PCH) 80 on the motherboard. The data pins 2A1-2A3 are respectively connected to a control pin LPC_LFRAME, a reset pin LPC_RST, and a clock pin LPC_CLK of the PCH 80. The data pin 2A4 is grounded. The data pins 1Y1-1Y4 are respectively connected to the pins 1-4 of the connector 20. The data pins 2Y1-2Y3 are respectively connected to the pins 7-9 of the connector 20. The data pin 2Y4 is grounded. The power VCC is connected to the standby power P3V3_STBY. The ground pin GND is grounded. The enable pins 1OE and 2OE are connected to the collector of the transistor Q1. In the embodiment, when the enable pins 1OE and 2OE both receive low level signals, the data pins 1A1-1A4 are respectively connected to the data pins 1Y1-1Y4, and the data pins 2A1-2A3 are respectively connected to the data pins 2Y1-2Y3. When the enable pin 1OE and 2OE both receive high level signals, the data pins 1A1-1A4 are disconnected from the data pins 1Y1-1Y4, and the data pins 2A1-2A3 are disconnected from the data pins 2Y1-2Y3.

In the embodiment, the switching chip 30 includes a first group of data pins 1A-4A, a second group of data pins 1Y-4Y, an enable pin OE, a ground pin GND, and a power pin VCC. The data pins 1A-4A are respectively connected to data pins JTAG_PLD_TCK, JTAG_PLD_TDO, JTAG_PLD_TMS, and JTAG_PLD_TDI of a complex programmable logic device (CPLD) 70 on the motherboard. The data pins 1Y-4Y are respectively connected to the pins 1-3 and 5 of the connector 20. The enable pin OE is connected to the collector of the transistor Q2. The power pin VCC is connected to the standby power P3V3_STBY. The ground pin GND is grounded. In the embodiment, when the enable pin OE receives a low level signal, the data pins 1A-4A are respectively connected to the data pins 1Y-4Y. When the enable pin OE receives a high level signal, the data pins 1A1-4A are disconnected from the data pins 1Y-4Y.

In use, when operators need to burn programs into the CPLD 70 through the connector 20, the terminals 12 and 13 of the base 50 are connected through the jumper 55. The base of the transistor Q1 is grounded. The transistor Q1 is turned off. The enable pins 1OE and 2OE of the switching chip 40 and the base of the transistor Q2 receive high level signals. The data pins 1A1-1A4 are disconnected from the data pins 1Y1-1Y4, and the data pins 2A1-2A3 are disconnected from the data pins 2Y1-2Y3 of the switching chip 40. As a result, the connector 20 is not electronically connected to the PCH 80. Furthermore, the transistor Q2 is turned on. The enable pin OE of the switching chip 30 receives a low level signal. The data pins 1A-4A are respectively connected to the data pins 1Y-4Y of the switching chip 30. As a result, the connector 20 is electronically connected to the CPLD 70 and transmits using the JTAG protocol. The operators can burn programs into the CPLD 70 through the connector 20.

When the operators needs to receive error codes through the connector 20 using a debugging card, the terminals 12 and 13 of the base 50 are disconnected from each other. At this time, the base of the transistor Q1 receives a high level signal. The transistor Q1 is turned on. The enable pins 1OE and 2OE of the switching chip 40 receive low level signals. The base of the transistor Q2 receives a low level signal. The transistor Q2 is turned off. The enable pin OE of the switching chip 30 receives a high level signal. The data pins 1A-4A are disconnected from the data pins 1Y-4Y of the switching chip 30. As a result, the connector 20 is not electronically connected to the CPLD 70. Furthermore, because the enable pins 1OE and 2OE of the switching chip 40 receive low level signals, the data pins 1A1-1A4 are respectively connected to the data pins 1Y1-1Y4, and the data pins 2A1-2A3 are respectively connected to the data pins 2Y1-2Y3 of the switching chip 40. As a result, the connector 20 is electronically connected to the PCH 80, and transmits data using the LPC protocol. The operators can receive error codes through the connector 20.

As described above, the base 50 and the jumper 55 can be used to ground the base of the transistor Q1 or not ground the base of the transistor Q1. In other words, the base 50 and the jumper 55 function as a switch. In other embodiments, the base 50 and the jumper 55 can be replaced by other switches, such as a button switch. In addition, the transistors Q1 and Q2 function as electronic switches. In other embodiments, the transistors Q1 and Q2 can be replaced by other electronic switches, such as metallic oxide semiconductor field effect transistors (MOSFETs).

The foregoing description of the exemplary embodiments of the disclosure has been presented only for the purposes of illustration and description and is not intended to be exhaustive or to limit the disclosure to the precise forms disclosed. Many modifications and variations are possible in the light of everything above. The embodiments were chosen and described in order to explain the principles of the disclosure and their practical application so as to enable others of ordinary skill in the art to utilize the disclosure and various embodiments with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A circuit for controlling a connector to transmit data according to Low Pin Count (LPC) protocol or Joint Test Action Group (JTAG) protocol, the connector comprising first to tenth pins, the sixth pin of the connector connected to a standby power, the tenth pin of the connector grounded, the circuit comprising:

a switch unit comprising a first terminal connected to the standby power through a first resistor, and a second terminal grounded;

a first electronic switch comprising first to third terminals, wherein the first terminal of the first electronic switch is connected to the first terminal of the switch unit, the second terminal of the first electronic switch is connected to the standby power through a second resistor, the third terminal of the first electronic switch is grounded, the first electronic switch is turned on in response to the first terminal of the first electronic switch receiving a high level signal, the first electronic switch is turned off in response to the first terminal of the first electronic switch receiving a low level signal;

a second electronic switch comprising first to third terminals, wherein the first terminal of the second electronic switch is connected to the second terminal of the first electronic switch, the second terminal of the second electronic switch is connected to the standby power through a third resistor, the third terminal of the second electronic switch is grounded, the second electronic switch is turned on in response to the first terminal of the second electronic switch receiving a high level signal, the second electronic switch is turned off in response to the first terminal of the second electronic switch receiving a low level signal;

a first switch chip comprising first to fourth groups of data pins, and first and second enable pins, wherein each group of data pins comprises four data pins, the first group of data pins are respectively connected to first to fourth data pins of a Platform Controller Hub (PCH), three of the second group of data pins are respectively connected to a control pin, a reset pin, and a clock pin of the PCH, the rest data pin of the second group of data pins is grounded, the third group of data pins are respectively connected to the first to fourth pins of the connector, three of the fourth group of data pins are respectively connected to the seventh to ninth pins of the connector, the fourth data pin of the fourth group of data pins is grounded, the first and second enable pins are connected to the second terminal of the first electronic switch; the first group of data pins are electronically connected to the third group of data pins, and the second group of data pins are electronically connected to the fourth group of data pins, in response to the first and second enable pins receiving low level signals, the connector transmits data according to Low Pin Count (LPC) protocol; the first group of data pins are disconnected from the third group of data pins, and the second group of data pins are disconnected from the fourth group of data pins, in response to the first and second enable pins receiving high level signals; and a second switch chip comprising first and second groups of data pins, and an enable pin, wherein each group of data pins of the second switch chip comprises four data pins, the first group of data pins of the second switch chip are respectively connected to first to fourth data pins of a complex programmable logic device (CPLD), three of the second group of data pins of the second switch chip are respectively connected to the first to third pins of the connector, the fourth data pin of the second group of data pins of the second switch chip is connected to the fifth pin of the connector, the enable pin of the switch chip is connected to the second terminal of the second electronic switch; the first group of data pins are respectively electronically connected to the second group of the data pins of the second switch chip in response to the enable pin of the second switch chip receiving a low level signal, the connector transmits data according to JTAG protocol; the first group of data pins are disconnected to the second group of the data pins of the second switch chip in response to the enable pin of the second switch chip receiving a high level signal.

2. The circuit of claim 1, further comprising a fourth resistor connected between the first terminal of the switch unit and the first terminal of the first electronic switch.

3. The circuit of claim 1, wherein the switch unit comprises a base and a jumper, the base comprises first to third terminals, the first terminal of the base is connected to the standby power through a fifth resistor, the second terminal of the base functions as the first terminal of the switch unit, the third terminal of the base functions as the second terminal of the switch unit, the jumper is either connected to or disconnected from the second terminal and the third terminal of the base.

4. The circuit of claim 1, wherein the first electronic switch is a transistor, a base of the transistor functions as the first terminal of the first electronic switch, a collector of the transistor functions as the second terminal of the first electronic switch, and an emitter of the transistor functions as the third terminal of the first electronic switch.

5. The circuit of claim 1, wherein the second electronic switch is a transistor, a base of the transistor functions as the first terminal of the second electronic switch, a collector of the transistor functions as the second terminal of the second electronic switch, and an emitter of the transistor functions as the third terminal of the second electronic switch.

* * * * *